US005759381A

United States Patent [19]

Sakurai et al.

[11] Patent Number: 5,759,381
[45] Date of Patent: Jun. 2, 1998

[54] SN-BI ALLOY-PLATING BATH AND METHOD FOR FORMING PLATED SN-BI ALLOY FILM

[75] Inventors: Hitoshi Sakurai; Ayumi Saito; Mayumi Date; Osamu Mita, all of Tokyo, Japan

[73] Assignee: Dipsol Chemicals Co., Ltd., Tokyo, Japan

[21] Appl. No.: 705,663

[22] Filed: Aug. 30, 1996

[30] Foreign Application Priority Data

Sep. 7, 1995 [JP] Japan .................................. 7-229981

[51] Int. Cl.⁶ ........................................................ C25D 3/32
[52] U.S. Cl. ......................... 205/253; 205/254; 106/1.25
[58] Field of Search .............................. 205/252, 253, 205/254; 106/1.25

[56] References Cited

U.S. PATENT DOCUMENTS 5,039,576  8/1991  Wilson ..................................... 205/254
5,296,128  3/1994  Gernon et al. .......................... 205/253

FOREIGN PATENT DOCUMENTS 02-88789  3/1990  Japan .

OTHER PUBLICATIONS

Database WPI, Derwent Publications, AN 86-143337, SU-A 1 191 492, Nov. 15, 1985.
Database WPI, Derwent Publications, AN 78-16585, JP-A 53 005 034, Jan. 18, 1978.

*Primary Examiner*—Kathryn L. Gorgos
*Assistant Examiner*—Kishor Mayekar
*Attorney, Agent, or Firm*—Oblon, Spivak, McClelland, Maier & Neustadt, P.C.

[57] ABSTRACT

An Sn—Bi alloy-plating bath comprises (i) Bi ions, (ii) Sn ions, (iii) ions of one metal selected from the group consisting of Cu, Co and Ag, and (iv) one member selected from the group consisting of carboxylic acids, lactone compounds, alkanesulfonic acids, alkanolsulfonic aicds, phenolsulfonic acids and salts thereof and is substantially free of lead ions. The bath permits the formation of an Sn—Bi alloy-plated film, does not form any plated film having impaired quality even at a temperature higher than about 100° C. and does not form any whisker.

17 Claims, No Drawings

5,759,381

SN-BI ALLOY-PLATING BATH AND METHOD FOR FORMING PLATED SN-BI ALLOY FILM

BACKGROUND OF THE INVENTION

The present invention relates to an Sn—Bi alloy-plating bath which is substantially free of Pb, in particular, an alloy-plating bath for solder as well as a method for forming a plated film of such an alloy.

The plated films of tin and solder have widely been used for the improvement in the solderability of substrates to be plated or as an etching resist in weak electrics and electronic industries. However, the tin-plating technique suffers from a problem of forming whiskers, while the problem of water-pollution with lead has recently been highlighted in the field of the solder-plating technique.

Recently, an Sn42-Bi alloy-plating technique has attracted special interest as a new plating technique free of such problems and it has partially been used as low melting point solder-plating in the field of electronic industries. However, the melting point of the conventional Sn-Pb eutectic solder is 183° C., while that of the Sn—Bi solder is low on the order of 139° C. and it undergoes a change in its texture near 100° C. which is practically used.

This gives a fatal blow to characteristic properties of solders (such as strength and solderability thereof) and the reliability of the resulting product. Therefore, there has been desired for the elimination of such a drawback and for the development of an Sn—Bi alloy-plating bath as well as a method for forming a plated film of such an alloy.

SUMMARY OF THE INVENTION

Accordingly, an object of the present invention is to provide a bath capable of forming an Sn—Bi alloy-plated film, which does not form a plated film having impaired quality even at a temperature on the order of about 100° C. and does not undergo the formation of any whisker.

Another object of the present invention is to provide a method for forming a plated film of such an alloy.

These and other objects of the present invention will be apparent from the following description and Examples.

The present inventors have conducted various studies to solve the foregoing problems associated with the conventional techniques, have found out that when at least one element selected from the group consisting of Cu, Co and Ag is added to an Sn—Bi alloy plating bath as a third component and a specific acid is also added thereto, an excellent plated film of an Sn—Bi alloy can be obtained even though the bath is substantially free of lead ions and thus have completed the present invention.

According to an aspect of the present invention, there is provided an Sn—Bi alloy-plating bath which comprises (i) Bi ions, (ii) Sn ions, (iii) ions of a metal selected from the group consisting of Cu, Co and Ag, (iv) one member selected from the group consisting of carboxylic acids, lactone compounds, alkanesulfonic acids, alkanolsulfonic aicds, phenolsulfonic acids and salts thereof, and a balance of water and which is substantially free of lead ions.

According to another aspect of the present invention, there is provided a method for forming a plated film of an Sn—Bi alloy which comprises the step of passing an electric current through a substrate to be plated which serves as a cathode and an anode, while the cathode and the anode are immersed in an Sn—Bi alloy-plating bath mentioned above.

DESCRIPTION OF THE PREFERRED EMBODIMENTS

The present invention will hereinafter be described in more detail.

The plating bath of the present invention comprises Bi, Sn, and Cu, Co and/or Ag ions, i.e., ionic components (i) to (iii). Sources of the Bi ions, Sn ions, Cu ions, Co ions and Ag ions used in the plating bath may be, for instance, bismuth compounds, tin compounds, copper compounds, cobalt compounds and silver compounds capable of being dissociated into these ions in aqueous solutions and each ionic component can easily be obtained by dissolving each corresponding compound in water or an acidic aguneous solution.

Examples of trivalent bismuth compounds, divalent tin compounds, divalent copper compounds, divalent cobalt compounds and monovalent silver compounds usable in the present invention are hydroxides, oxides, sulfates, hydrochlorides, sulfamic acid salts, pyrophosphates, carboxylic acid salts, amino acid salts or sulfonates of these metals. Among these, oxides, sulfates and hydrochlorides of these metals is preferred. Specific examples of carboxylic acid salts are polyoxymonocarboxylic acid salts, polyoxylactones and polycarboxylic acid salts as well as salts with monocarboxylic acids such as formic acid, acetic acid and propionic acid, and oxycarboxylic acids such as lactic acid and glycollic acid. In this connection, it is preferable that the carboxylic acids has 1 to 7 carbon atoms.

In addition, specific examples of amino acid salts include salts with asparagine, histidine, leucine, serine, valine, tyrosine, tryptophane, proline, glycine and alanine. Examples of sulfonic acid salts are alkanesulfonic acid salts, alkanolsulfonic acid salts and phenolsulfonic acid salts. In this connection, it is preferable that the amion acids have 2 to 11 carbon atoms and the sulfonic acids have 1 to 8 carbon atoms. Among these, specific examples of alkanesulfonic acid salts include salts of methanesulfonic acid, ethanesulfonic acid, propanesulfonic acid, isopropanesulfonic acid, butanesulfonic acid, pentanesulfonic acid and hexanesulfonic acid; specific examples of alkanolsulfonic acid salts are salts of 2-hydroxyethanesulfonic acid, 3-hydroxypropanesulfonic acid and 2-hydroxybutanesulfonic acid; and specific examples of phenolsulfonic acid salts are salts of phenolsulfonic acid, cresolsulfonic acid and dimethylphenolsulfonic acid.

The concentration of each ionic species in the plating bath of the present invention may appropriately be adjusted, but that of trivalent bismuth ions preferably ranges from 0.2 to 40 g/l. The concentration of divalent tin ions preferably ranges from 1 to 50 g/l, more preferably 5 to 40 g/l. The concentrations of copper ions, cobalt ions and silver ions as the third components preferably range from 0.01 to 1 g/l; 0.1 to 5 g/l; and 0.01 to 5 g/l, respectively.

The plating bath according to the present invention comprises, in addition to the foregoing metal ions, at least one member selected from the group consisting of carboxylic acids, lactone compounds, alkanesulfonic acids, alkanolsulfonic acids, phenolsulfonic acids and salts thereof. More specifically, the carboxylic acids are preferably of 3 to 9 carbon atoms and may be, for instance, polyoxymonocarboxylic acids, polycarboxylic acids and aminocarboxylic acids.

Examples of polyoxymonocarboxylic acids usable in the present invention may be compounds each having not less than 2, preferably 2 to 6 hydroxyl groups and one carboxyl group in the molecule. Preferred such compounds are those having 3 to 7 carbon atoms. Specific examples thereof are glyceric acid, gluconic acid and glucoheptonic acid.

Specific examples of polycarboxylic acids and aminocarboxylic acids which may be used in the plating bath of the invention are malonic acid, maleic acid, succinic acid, tricarballylic acid, citric acid, tartaric acid, malic acid, 2-sulfoethylimino-N,N-diacetic acid, iminodiacetic acid, nitrilotriacetic acid, EDTA, triethylenediaminetetraacetic acid, glutamic acid, asparagic acid and β-alanine-N,N-diacetic acid. Among these, malonic acid, citric acid, malic acid, EDTA and glutamic acid are preferably used.

The lactone compounds usable in the plating bath of the invention are preferably polyoxylactones, which are lactones each having at least two, preferably 2 to 5 hydroxyl groups in the molecule. Preferred such compounds are those having 3 to 7 carbon atoms. Specific examples thereof are gluconolactone and glucoheptonolactone.

Specific examples of alkanesulfonic acids, alkanolsulfonic acids and phenolsulfonic acids include alkanesulfonic acids such as methanesulfonic acid, ethanesulfonic acid, propanesulfonic acid, isopropanesulfonic acid, butanesulfonic acid, pentanesulfonic acid and hexanesulfonic acid; alkanolsulfonic acids such as 2-hydroxyethanesulfonic acid, 3-hydroxypropanesulfonic acid and 2-hydroxybutanesulfonic acid; and phenolsulfonic acids such as phenolsulfonic acid, cresolsulfonic acid and dimethylphenolsulfonic acid. In this connection, it is preferable that the alkanesulfonic acids have 1 to 6 carbon atoms, the alkanolsulfonic acids have 2 to 4 carbon atoms, and the phenolsulfonic acids have 6 to 8 carbon atoms.

Examples of salts of the foregoing acids include alkali metal salts (such as sodium, potassium and lithium salts); alkaline earth metal salts (such as magnesium, calcium and barium salts); divalent tin salts, bismuth salts, ammonium salts and organic amine salts (such as monomethylamine, dimethylamine, trimethylamine, ethylamine, isopropylamine, ethylenediamine and diethylenetriamine salts). Among these salts, preferred are sodium salts, potassium salts, ammonium salts, divalent tin salts and bismuth salts.

The aforementioned polyoxymonocarboxylic acids, polyoxylactone compounds, polycarboxylic acids, aminocarboxylic acids, alkanesulfonic acids, alkanolsulfonic acids, phenolsulfonic acids and salts thereof may be used alone or in any combination of at least two of these compounds.

The concentration of the polyoxymonocarboxylic acid, polyoxylactone compound, polycarboxylic acid, aminocarboxylic acid, alkanesulfonic acid, alkanolsulfonic acid, phenolsulfonic acid, salt thereof or combination thereof is not restricted to any particular range, but preferably ranges from 0.2 to 2.0 mole/l and particularly preferably 0.25 to 1.0 mole/l.

When the Bi ion, Sn ion, Cu ion, Co ion or Ag ion component is added to the bath in the form of a carboxylic acid, a lactone compound, an alkanesulfonic acid, an alkanolsulfonic acid or a phenolsulfonic acid salt, such an acid must not necessarily be added to the bath, but if the concentration thereof does not fall within the range defined above, the acid may be replenished in such an amount required for achieving the desired level defined above.

Moreover, the plating bath of the present invention preferably comprises an electrically conductive salt for the improvement in the electric conductivity and an additive for making the resulting plated film compact.

The plating bath of the present invention may comprise, as such an electrically conductive salt, an alkali metal salt (such as sodium, potassium or lithium salt), an alkaline earth metal salt (such as magnesium, calcium or barium salt), an ammonium salt, an organic amine salt (such as monomethylamine, dimethylamine, trimethylamine, ethylamine, isopropylamine, ethylenediamine or diethylenetriamine salt) of an acid such as sulfuric acid, hydrochloric acid, sulfamic acid, pyrophosphoric acid or sulfonic acid. Specific examples thereof include ammonium sulfate, ammonium chloride, sodium pyrophosphate and monomethylamine sulfamate. Among these, ammonium sulfate and ammonium chloride are particularly preferred. The plating bath may comprise these salts in a content ranging from 10 to 200 g/l and preferably 50 to 150 g/l.

The plating bath of the present invention may further comprise a brightener and/or a smoothing or leveling agent, in addition to the foregoing components. Examples of such brighteners and smoothing agents are nonionic surfactants such as ethylene oxide adduct of alkyl phenyl ethers, polyamides, peptone and gelatin. When these brighteners and smoothing agents are incorporated into the plating bath, the content thereof desirably ranges from 0.1 to 20 g/l and preferably 2 to 10 g/l. The addition of these brighteners and smoothing agents permits the formation of a uniform plated film having fine texture.

The balance of the Sn—Bi alloy-plating bath of the present invention, which comprises the components detailed above, is water and the pH value thereof preferably ranges from 2 to 9, more preferably 4 to 8. This is because if the pH value thereof is less than 2 and it exceeds 9, the stability of the metal ions present in the plating bath is reduced.

The pH value thereof may be controlled by appropriately adjusting the rates of the foregoing components to be used within the ranges defined above. Alternatively, the pH value may likewise be controlled to a level falling within the range specified above by addition of an acid or an alkali to the bath.

Incidentally, when using a metal oxide as a source of metal ions present in the plating bath, such a metal oxide is hardly dissolved in water at a pH falling within the range defined above. Therefore, it is desirable that the metal oxide be dissolved in water, in advance, in the presence of a strong acid and then the pH value thereof be adjusted to a value falling within the range using an alkali.

Examples of such strong acids usable herein are sulfuric acid, hydrochloric acid, sulfonic acid and pyrophosphoric acid. In addition, examples of alkalis used in the neutralization are sodium hydroxide, potassium hydroxide and aqueous ammonia.

The plating bath according to the present invention is substantially free of lead ion and preferably the bath does not comprise any lead ion at all.

According to the present invention, there is also provided a method for forming a plated film of an Sn—Bi alloy which makes use of the foregoing plating bath. The method will hereinafter be described in more detail.

The substrate (substance to be plated) to which the plating bath of the present invention can be applied in order to form a plated film thereon may be, for instance, metals such as copper and copper alloys (such as brass), iron and iron alloys and nickel and nickel alloys; and metal composites with insulating materials such as ceramics, lead glass, plastics and ferrite. The method of the present invention is effective, in particular, when it is applied to a metal composite with an insulating material such as a ceramic material, lead glass, a plastic or a ferrite. In the method of the present invention, the substance to be plated serves as a cathode, while using an anode of, for instance, a tin-bismuth alloy, elemental bismuth or elemental tini or optionally an insoluble anode such as a platinum-plated titanium plate or a carbon plate. The bath temperature during the plating operation in general ranges from 10° to 40° C. and preferably 15° to 30° C. It is in general desirable to control the cathodic current density to the range of from 0.1 to 5 A/dm². The plating time in general varties depending on the desired thickness of the resulting plated film, but in general ranges from 1 to 120 minutes and preferably 5 to 60 minutes. The bath liquid may be mechanically stirred by, for instance, a fluid flow or a cathode-rocker. The method permits the formation of plated films having a thickness falling within a wide range, but the thickness thereof in general ranges from 0.5 to 500 µm and preferably 5 to 20µm.

The Bi content of the resulting Sn—Bi alloy plate in general ranges from 0.1 to 75% by weight (hereinafter simply referred to as "%") and preferably 5 to 70%.

Moreover, the content of the metal as the third component preferably ranges from 0.1 to 10% for Cu, 0.1 to 5% for Co, or 0.1 to 5% for Ag.

When practicing the plating method of the present invention, it is preferred to maintain the pH value of the plating bath at a level ranging from 2 to 9, throughout the plating operation.

If a substrate is plated according to the method, the substrate is subjected to a pre-treatment according to the usual manner prior to the plating step. Such a pre-treatment comprises at least one step selected from the group consisting of degreasing through immersion, washing with an acid, electrolytic washing of an anode and activation of the anode. It is preferred to carry out water-washing between the subsequent two steps as the pre-treatment. After the plating, it is sufficient to lightly wash the resulting plated film, followed by drying. The plating step may be carried out in a stationary bath or a barrel. Moreover, the resulting plated film may be subjected to an anti-tarnishing treatment (such as immersion in an aqueous solution of sodium tertiary phosphate), which is performed after the tin-plating or solder-plating process.

The plating bath according to the present invention may be used over a long time period without replacing the liquid, by maintaining the content of each bath component at a constant level through the use of an appropriate replenishing agent.

As has been mentioned above in detail, the present invention permits the formation of a plated film of an Sn—Bi alloy which comprises 0.1 to 75%, preferably 1 to 50% Bi, and as a third component, at least one member selected from the group consisting of Cu, Co and Ag in a content ranging from 0.1 to 10% for Cu; 0.1 to 5% for Co; or 0.1 to 5% for Ag over a wide current density range. In addition, the plating bath of the present invention does not form any precipitates or does not become turbid even if it is stored over a long time period and the bath only causes a quite small change in the composition and is thus very stable.

The method of the present invention in which the plating bath of the present invention is used permits the formation of a plated film of an Sn—Bi alloy on a substrate, which hardly causes any change in texture even at a temperature near 100° C. and which shows solderability and whisker-forming properties comparable to those of the presently used Sn—Pb alloy-plating (solder-plating). Moreover, the pH value of the plating bath of the present invention falls within the medium pH region ranging from 2 to 9 and therefore, the plating bath permits reliable plating of substances to be plated such as ceramics, lead glass, plastics and ferrite without causing any erosion thereof.

The present invention will hereinafter be described in more detail with reference to the following working Examples.

EXAMPLE 1

A copper plate was degreased with a 5 w/v % Degrease-39 (available from Dipsol Company) and then washed with a 10.5 w/w % hydrochloric acid solution, followed by electrolytic washing with a 5 w/w % NC-20 (available from Dipsol Company) and a 7 w/v % aqueous sodium hydroxide solution. After the electrolytic washing, the copper plate was activated by a 3.5% hydrochloric acid. The copper plate was washed between every successive two operations.

On the other hand, each plating solution having the composition shown in the following Table 1 was introduced into a plating tank made of an acryl resin. A platinum plate was used as an anode and the copper plate which had been activated above was connected to a cathode. The plating of the copper plate was carried out under the conditions specified in the following Table 2. In this connection, the metal compounds used for preparing the plating bath were tin sulfate, bismuth sulfate, copper sulfate, cobalt sulfate and silver sulfate.

The resulting plated film was inspected for the thickness and the alloy composition. The thickness of the plated film was determined by an electromagnetic thicknessmeter and the alloy composition thereof was determined by the fluorescent X-ray analysis.

Then the resulting plated film was inspected for the solderability and whisker formation.

Solderability

This was evaluated by determining the point (zero cross time) at which the buoyancy due to wetting was equal to zero, using the vertical immersion method by Meniscograph (a solder checker available from Leska Company).

Evaluation of Whisker Formation

Each plated film formed on a brass substrate was subjected to an acceleration test wherein the plated film was allowed to stand over 7 days in a thermostatic chamber maintained at 50° C. and then the plated surface was observed.

Stability of Plating Bath

After allowing each plating liquid to stand at room temperature for one week and it was inspected for the formation of precipitates and observed whether the liquid became turbid or not in order to evaluate the stability of each plating bath.

Stability of Plated Film

The distribution of elemental components on the cross section of each plated film was observed using an X-ray analysis device (available from Horiba Works, Ltd.) and the results obtained before and after a heat-treatment at 125° C. for 200 hr were compared to one another to thus evaluate the stability of the film.

The results of these measurements are summarized in the following Table 3.

TABLE 1

Composition of Plating Bath

| No. | 1 | 2 | 3 | 4 | 5 | 6 | 7 | 8 | 9 | 10 |
|---|---|---|---|---|---|---|---|---|---|---|
| $Sn^{2+}$ (g/l) | 15 | 15 | 20 | 20 | 20 | 20 | 20 | 20 | 30 | 30 |
| $Bi^{3+}$ | 2 | 4 | 2 | 2 | 2 | 2 | 4 | 4 | 2 | 8 |
| $Cu^{2+}$ | — | — | — | 0.1 | 0.5 | 0.02 | 0.5 | — | 0.05 | — |
| $Co^{2+}$ | — | 4 | 2 | — | — | — | 2 | 4 | — | — |
| $Ag^+$ | 0.2 | — | — | — | — | 0.4 | — | 0.1 | — | 1 |
| Citric Acid | — | — | 100 | — | — | — | 100 | — | — | — |
| Malonic Acid | 100 | — | — | — | — | — | — | — | — | 50 |
| Gluconic Acid | — | — | — | 150 | — | 100 | — | — | 100 | — |
| Gluconolactone | — | — | — | — | 100 | — | — | 150 | — | 100 |
| Glutamic Acid | — | — | — | — | 50 | 100 | — | — | 50 | 50 |
| 2-hydroxyethane-sulfonic Acid | — | 120 | — | — | — | — | 50 | — | — | — |
| Ammonium Sulfate | — | 100 | 100 | — | — | — | 100 | — | — | — |
| Ammonium Sulfamate | 100 | — | — | — | 100 | — | — | 100 | — | — |
| Na Methanesulfonate | — | — | — | 100 | — | 50 | — | — | 100 | 50 |
| Brightener I*¹ | — | 5 | 5 | — | — | 5 | 5 | 4 | — | — |
| Polyamide | — | — | — | 4 | — | — | 1 | — | 2 | — |
| Peptone | 2 | — | — | — | — | — | — | 1 | — | 2 |
| pH | 8.5 | 3.0 | 4.0 | 5.0 | 6.5 | 5.0 | 4.5 | 5.0 | 6.0 | 7.0 |

*¹Ethylene oxide (15 mole) adduct of nonyl phenyl ether.

TABLE 2

Conditions for Plating

| No. | 1 | 2 | 3 | 4 | 5 | 6 | 7 | 8 | 9 | 10 |
|---|---|---|---|---|---|---|---|---|---|---|
| Cathodic Current Density ($A/dm^2$) | 2.0 | 2.0 | 2.0 | 0.5 | 0.5 | 0.5 | 0.2 | 0.2 | 0.2 | 5.0 |
| Plating Temp. (°C.) | 25 | 25 | 25 | 25 | 25 | 25 | 25 | 25 | 25 | 25 |
| Plating Time (min) | 10 | 10 | 10 | 30 | 30 | 30 | 60 | 60 | 60 | 4 |

TABLE 3

Properties of Plated Film

| No. | 1 | 2 | 3 | 4 | 5 | 6 | 7 | 8 | 9 | 10 |
|---|---|---|---|---|---|---|---|---|---|---|
| Appearance of Plated Film*² | X | X | X | Δ | Δ | Δ | Δ | Δ | Δ | X |
| Thickness of Film (μm) | 5~6 | 5~6 | 5~6 | 5~6 | 5~6 | 5~6 | 5~6 | 5~6 | 5~6 | 5~6 |
| Bi Content (%) | 28 | 40 | 10 | 8 | 2 | 10 | 20 | 20 | 5 | 5 |
| Cu Content (%) | — | — | — | 2 | 8 | 1 | 5 | — | 2 | — |
| Co Content (%) | — | 2 | 1 | — | — | — | 2 | 4 | — | — |
| Ag Content (%) | 2 | — | — | — | — | 4 | — | 1 | — | 5 |
| Change in Tex. of Film*³ | None | None | None | None | None | None | None | None | None | None |
| Formation of Whisker | None | None | None | None | None | None | None | None | None*⁶ | None |
| Solderability*⁴ | 1.1 | 1.0 | 1.3 | 1.3 | 1.5 | 1.3 | 1.2 | 1.2 | 1.4 | 1.4 |
| Stability of Bath*⁵ | None | None | None | None | None | None | None | None | None | None |

*²Δ: Semigloss; X: Dull
*³Change in the distribution of elemental metal components in each plated film before and after the heat-treatment at 125° C. for 200 hr.
*⁴Test piece size: 10 mm × 100 mm × 0.3 mm; Immersion Depth: 4 mm; Soldering Temp.: 235° C.; Flux: rosin type one.
*⁵The condition of each bath after allowing to stand at room temperature over 5 days (formation of precipitates; turbidity)
*⁶There were observed lump-like projections.

COMPARATIVE EXAMPLE 1

The same procedures used in Example 1 were repeated except for using each plating liquid having a composition shown in the following Table 4 and the conditions for plating listed in the following Table 5. In this connection, the metal compounds used for preparing the plating bath were tin borofluoride and lead borofluoride for the bath No. a and tin sulfate and bismuth sulfate for the bath Nos. b to e.

TABLE 4

Composition of Plating Bath (Comp. Ex.)

| No. | a | b | c | d | e |
|---|---|---|---|---|---|
| $Sn^{2+}$ (g/l) | 18 | 1.8 | 1.8 | 22.5 | 22.5 |
| $Bi^{3+}$ | — | 7.1 | 7.1 | 2.5 | 7.5 |
| $Pb^{2+}$ | 9 | — | — | — | — |
| Sulfuric Acid | — | 100 | — | — | — |
| Methanesulfonic Acid | — | — | 98 | — | — |
| Gluconic Acid | — | 50 | — | — | 120 |
| Citric Acid | — | — | 50 | 120 | — |
| Ammonium Sulfate | — | — | — | 80 | 80 |
| Borofluoric Acid | 180 | — | — | — | — |
| Boric Acid | 20 | — | — | — | — |
| Brightener*1 | — | 5 | 5 | 5 | 5 |
| Peptone | 1 | — | — | — | — |
| pH | 1> | 0.5> | 0.5> | 8.0 | 3.5 |

TABLE 5

Conditions for Plating (Comp. Ex.)

| No. | a | b | c | d | e |
|---|---|---|---|---|---|
| Cathodic Current Density (A/dm²) | 2.0 | 0.3 | 0.3 | 0.2 | 0.5 |
| Plating Temp. (°C.) | 20 | 20 | 20 | 20 | 25 |
| Plating Time (min) | 6 | 40 | 40 | 60 | 30 |

TABLE 6

Properties of Plated Film (Comp. Ex.)

| No. | a | b | c | d | e |
|---|---|---|---|---|---|
| Appearance of Plated Film*2 | X | Δ | Δ | Δ | X |
| Thickness of Plated Film (μm) | 5–6 | 5–6 | 5–6 | 5–6 | 5–6 |
| Bi Content (%) | — | 35 | 35 | 7 | 38 |
| Pb Content (%) | 40 | — | — | — | — |
| Change in Tex. of Plated Film*3 | None | observed | observed | observed | observed |
| Formation of Whisker | None | None | None | None*6 | None |
| Solderability*4 | 1.0 | 1.0 | 1.0 | 1.2 | 1.0 |
| Stability of Bath*5 | None | observed | observed | None | None |

*2 to *6: see Table 3.

EXAMPLE 2 AND COMPARATIVE EXAMPLES 2 TO 6

The same procedures used in Example 1 and Comparative Example 1 were repeated using the plating bath Nos. 1 to 10 used in Example 1 and Nos. a to e used in Comparative Example 1 except that a composite part comprising silver and ferrite was substituted for the copper plate used above to plate the composite part and to thus evaluate the erosive action of each plating bath to the ferrite. The erosive action was observed by a stereomicroscope. The results thus obtained are listed in the following Table 7.

TABLE 7

| | Present Invention | | | | | | | | | |
|---|---|---|---|---|---|---|---|---|---|---|
| Test No. | 11 | 12 | 13 | 14 | 15 | 16 | 17 | 18 | 19 | 20 |
| Plating Bath*7 | 1 | 2 | 3 | 4 | 5 | 6 | 7 | 8 | 9 | 10 |
| Erosion | None | None | None | None | None | None | None | None | None | None |

| | Comparative Example | | | | |
|---|---|---|---|---|---|
| Test No. | 2 | 3 | 4 | 5 | 6 |
| Plating Bath*7 | a | b | c | d | e |
| Erosion | observed | observed | observed | None | None |

*7: The plating baths used are represented by the bath numbers used in Example 1 and Comparative Example 1.

What is claimed is:

1. An Sn—Bi alloy-plating bath characterized in that it comprises (i) Bi ions, (ii) Sn ions, (iii) ions of at least one metal selected from the group consisting of Cu, Co and Ag, (iv) one member selected from the group consisting of carboxylic acids, lactone compounds and salts thereof and a balance of water, wherein concentration of Bi ions ranges from 0.2 to 40 g/l; concentration of Sn ions ranges from 1 to 50 g/l; and concentrations of Cu, Co and Ag ions range from 0.01 to 1 g/l, 0.1 to 5 g/l and 0.01 to 5 g/l respectively, said bath being free of lead ions.

2. The Sn—Bi alloy-plating bath of claim 1 wherein it comprises Bi ions in an amount capable of forming an Sn—Bi alloy plated film having a Bi content ranging from 0.1 to 75% by weight.

3. The Sn—Bi alloy-plating bath of claim 1 wherein it has a pH ranging from 2 to 9.

4. The Sn—Bi alloy-plating bath of claim 1 wherein concentration of the component (iv) ranges from 0.2 to 2.0 mole/l.

5. The Sn—Bi alloy-plating bath of claim 1 wherein it further comprises an electrically conductive salt in an amount ranging from 10 to 200 g/l.

6. The Sn—Bi alloy-plating bath of claim 1 wherein it further comprises an additional component selected from the group consisting of a brightener, smoothing agent and a mixture thereof, said additional component being present in an amount ranging from 0.1 to 20 g/l.

7. An Sn—Bi alloy-plating bath characterized in that it comprises (i) trivalent Bi ions of 0.2 to 40 g/l, (ii) divalent Sn ions of 1 to 50 g/l, (iii) ions of at least one metal selected from the group consisting of Cu, Co and Ag wherein concentrations of Cu, Co and Ag range from 0.01 to 1 g/l, 0.1 to 5 g/l and 0.01 to 5 g/l respectively, (iv) one member selected from the group consisting of carboxylic acids, lactone compounds and salts thereof, concentration of the component (iv) ranging from 0.2 to 2.0 mole/l and a balance of water, said bath having a pH ranging from 2 to 9 and being free of lead ions .

8. The Sn—Bi alloy-plating bath of claim 7 wherein it further comprises an electrically conductive salt in an amount ranging from 10 to 200 g/l.

9. The Sn—Bi alloy-plating bath of claim 7 wherein it further comprises an additional component selected from the group consisting of a brightener, smoothing agent and a mixture thereof, said additional component being present in an amount ranging from 0.1 to 20 g/l.

10. A method for forming a plated film of an Sn—Bi alloy which comprises the step of applying an electric current through a substance to be plated which serves as a cathode and an anode, the cathode and the anode being immersed in an Sn—Bi alloy-plating bath which comprises (i) Bi ions, (ii) Sn ions, (iii) ions of at least one metal selected from the group consisting of Cu, Co and Ag, and (iv) one member selected from the group consisting of carboxylic acids, lactone compounds and salts thereof, and a balance of water, wherein concentration of Bi ions ranges from 0.2 to 40 g/l; concentration of Sn ions ranges from 1 to 50 g/l; and concentrations of Cu, Co and Ag ions range from 0.01 to 1 g/l, 0.1 to 5 g/l and 0.01 to 5 g/l respectively, said bath being free of lead ions.

11. The method of claim 10 wherein the substrate is a metal composite with an insulating material selected from the group consisting of ceramic materials, lead glass, plastics and ferrite.

12. The method of claim 10 wherein the plating is carried out at a bath temperature ranging from 15° to 30° C. and a cathodic current density ranging from 0.1 to 5 A/dm$^2$ for 5 to 60 minutes.

13. The method of claim 10 wherein the bath has a pH ranging from 2 to 9.

14. The method of claim 10 wherein concentration of the component (iv) ranges from 0.2 to 2.0 mole/l.

15. The method of claim 10 wherein the bath comprises (i) trivalent Bi ions of 0.2 to 40 g/l, (ii) divalent Sn ions ranges from 1 to 50 g/l, (iii) ions of at least one metal selected from the group consisting of Cu, Co and Ag wherein concentrations of Cu, Co and Ag range from 0.01 to 1 g/l, 0.1 to 5 g/l and 0.01 to 5 g/l respectively, (iv) one member selected from the group consisting of carboxylic acids, lactone compounds and salts thereof, concentration of the component (iv) ranging from 0.2 to 2.0 mole/l and a balance of water, said bath having a pH ranging from 2 to 9 and being free of lead ions.

16. The method of claim 10 wherein the bath further comprises an electrically conductive salt in an amount ranging from 10 to 200 g/l.

17. The method of claim 10 wherein the bath further comprises an additional component selected from the goup consisting of a brightener, smoothing agent and a mixture thereof, said additional component being present in an amount ranging from 0.1 to 20 g/l.

* * * * *